(12) United States Patent  
Lee

(10) Patent No.: US 8,304,175 B2
(45) Date of Patent: Nov. 6, 2012

(54) PATTERNING METHOD

(75) Inventor: Hong-Ji Lee, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 509 days.

(21) Appl. No.: 12/411,169

(22) Filed: Mar. 25, 2009

(65) Prior Publication Data

US 2010/0248160 A1 Sep. 30, 2010

(51) Int. Cl.
G03F 7/26 (2006.01)
(52) U.S. Cl. ........................ 430/314; 430/324
(58) Field of Classification Search .................. 430/324, 430/322, 311, 313, 314
See application file for complete search history.

(56) References Cited

U.S. PATENT DOCUMENTS

2004/0023475 A1* 2/2004 Bonser et al. ................ 438/585
2004/0043623 A1* 3/2004 Liu et al. ...................... 438/736
2004/0102048 A1* 5/2004 Yamaguchi ................... 438/694

* cited by examiner

Primary Examiner — Cynthia Kelly
Assistant Examiner — Caleen Sullivan
(74) Attorney, Agent, or Firm — J.C. Patents

(57) ABSTRACT

A patterning method is provided. First, a material layer is formed on a substrate. Thereafter, an ashable layer is formed on the material layer. Afterwards, a patterned transfer layer is formed on the ashable layer, wherein the patterned transfer layer has a critical dimension less than the exposure limit dimension. Further, the ashable layer is patterned using the patterned transfer layer or a complementary layer of the patterned transfer layer as a mask, so as to form a patterned ashable layer. The material layer is then patterned using the patterned ashable layer as a mask.

18 Claims, 17 Drawing Sheets

PATTERNING METHOD

BACKGROUND OF THE INVENTION

1. Field of Invention

The present invention relates to a semiconductor fabrication method, and more particularly to a patterning method.

2. Description of Related Art

As the degree of integration of a memory device is getting higher, the dimension of the same is getting smaller, and the channel length becomes shorter to increase the device operation speed. However, the short channel effect is generated when the channel length is shortened to a certain extent, and the performance of the device is reduced.

In a non-volatile memory, channel regions are under word lines. To increase the channel length, one known method is to maintain the pitch but increase the line width of word lines (or reduce the gap between word lines), so as to avoid the short channel effect at the same device density. However, the line width of word lines is limited by the exposure limit dimension of a lithography process. For example, the method of forming word lines includes sequentially forming a conductive layer and a patterned photoresist layer on a substrate. The patterned photoresist layer has an opening and covers a portion of the conductive layer for forming the word lines. When each word line to be formed is wide, the opening of the patterned photoresist layer is reduced, so that photoresist scum is generated in the opening. Therefore, the process window is very narrow. Accordingly, to fabricate a wider word line without photoresist scum resulted from the narrow process window has become an important topic in the industry.

SUMMARY OF THE INVENTION

The present invention provides a patterning method with wider process window, in which a wider word line or a smaller opening can be fabricated with the existing manufacturing equipment.

The present invention provides a patterning method. First, a material layer is formed on a substrate. Thereafter, an ashable layer is formed on the material layer. Afterwards, a patterned transfer layer is formed on the ashable layer, wherein the patterned transfer layer has a critical dimension less than the exposure limit dimension. Further, the ashable layer is patterned using the patterned transfer layer or a complementary layer of the patterned transfer layer as a mask, so as to form a patterned ashable layer. The material layer is then patterned using the patterned ashable layer as a mask. During the step of forming the patterned transfer layer, at least one trimming process for reducing the line width or at least one polymer deposition process for reducing the opening width can be applied.

The present invention provides a patterning method, in which a wider word line can be fabricated at the same device density, so that the short channel effect can be reduced, and the performance of the device can be enhanced. Moreover, the patterning method can be applied to fabricate a smaller contact plug or via hole, so that the pattern density can be increased by up to two times without replacing existing machines and photoresists. Further, the patterning method can be applied to fabricate a self-aligned dual damascene opening. The process window is wider and the overlay requirement of the dual damascene opening is easily met.

In order to make the aforementioned and other objects, features and advantages of the present invention comprehensible, preferred embodiments accompanied with figures are described in detail below.

DESCRIPTION OF EMBODIMENTS

First Embodiment

FIGS. 1A to 1I schematically illustrate, in a cross-sectional view, a patterning method according to the first embodiment of the present invention.

Figure 1A:
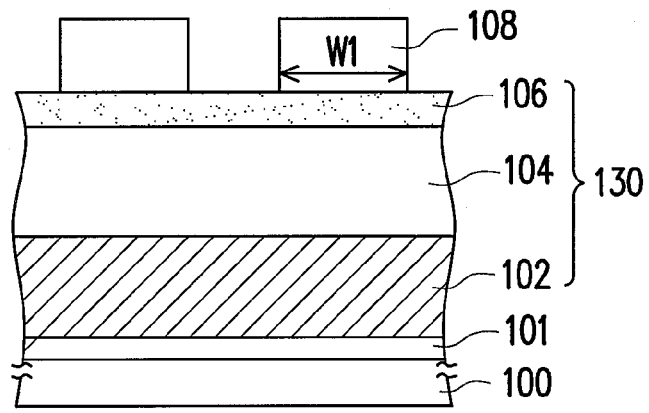
FIGS. 1A to 1I schematically illustrate, in a cross-sectional view, a patterning method according to the first embodiment of the present invention.

Referring to FIG. 1A, a material layer 102, an ashable layer 104, a transfer layer 106 and a patterned photoresist layer 108 are sequentially formed on a substrate 100. The substrate 100 may be a silicon substrate. The material layer 102 includes a conductive material, such as metal, polysilicon, polycide or metal salicide, for example. In this embodiment, the material layer 102 includes polysilicon, and the thickness thereof is about 800 Å, for example. The ashable layer 104 is a non-photosensitive layer, and the material thereof includes amorphous carbon ($\alpha$-C) or polymer. In this embodiment, the ashable layer 104 includes $\alpha$-C, and the thickness thereof is about 1500 Å, for example. The transfer layer 106 includes silicon oxide ($SiO_2$) or silicon oxynitride (SiON), for example. In this embodiment, the transfer layer 106 includes $SiO_2$, and the thickness thereof is about 500 Å, for example. In addition, the method of forming the material layer 102, the ashable layer 104 and the transfer layer 106 includes performing a chemical vapor deposition (CVD) process, for example. The line width of the patterned photoresist layer 108 is W1, and W1 is equal to the exposure limit dimension, for example. Further, a dielectric layer 101 is optionally formed on the substrate 100 before the material layer 102 is formed. The dielectric layer 101 is a $SiO_2$ layer or an ONO (oxide-nitride-oxide) layer and the forming method thereof includes performing a CVD process, for example.

Figure 1B:
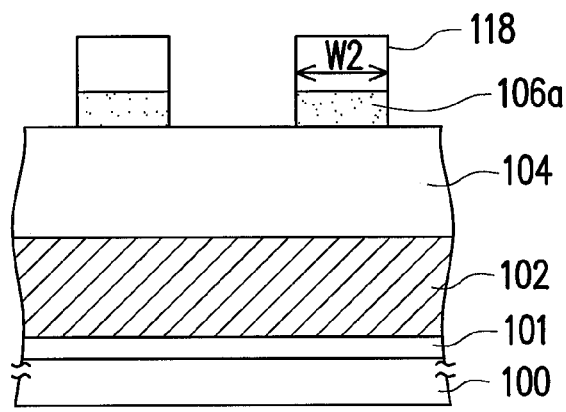

Referring to FIG. 1B, a first trimming process is performed to the patterned photoresist layer 108, so as to form a trimmed patterned photoresist layer 118. The first trimming process includes an etching process, in which the reaction gas includes $O_2$ and $CF_4$, for example. Thereafter, the transfer layer 106 is patterned using the trimmed patterned photoresist layer 118 as a mask, so as to form a patterned transfer layer 106a. The line width of the patterned transfer layer 106a is W2. In this step, W1 is trimmed to W2; thus, W2 is less than the exposure limit dimension because W1 is equal to the exposure limit dimension. The trimming process can shrink W2 to 90% of W1 or even less. The method of patterning the transfer layer 106 includes performing an etching process, in which the reaction gas includes $CF_4$, $CHF_3$ and Ar, for example.

Figure 1C:
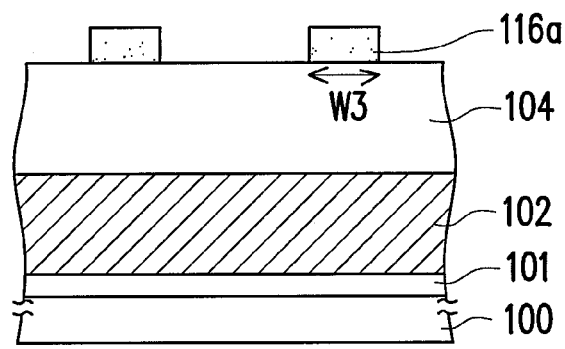

Referring to FIG. 1C, a second trimming process is performed to the patterned transfer layer 106a, so as to form a patterned transfer layer 116a. The line width of the patterned transfer layer 116a is W3. In this step, W2 is trimmed to W3, and W3 is less than the exposure limit dimension. The steps in FIGS. 1B and 1C can be performed in the same chamber. Thereafter, the trimmed patterned photoresist layer is removed. It is noted that either the first trimming process or the second trimming process can be optional. In other words, the patterned transfer layer 116a can be formed by only performing the first trimming process or the second trimming process.

As shown in FIGS. 1A to 1C, the material layer 102 and the ashable layer 104 are sequentially formed on the substrate 100, and then the patterned transfer layer 116a is formed on the ashable layer 104.

Figure 1D:
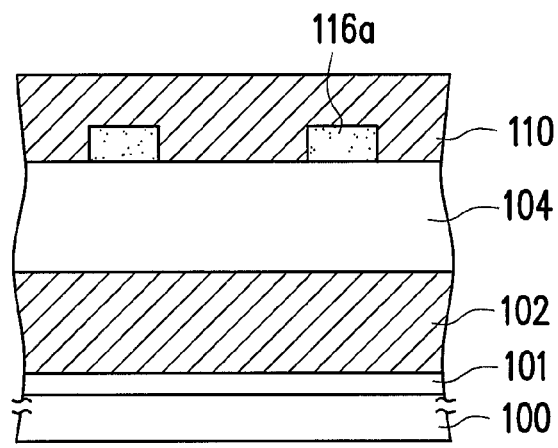
Figure 1E:
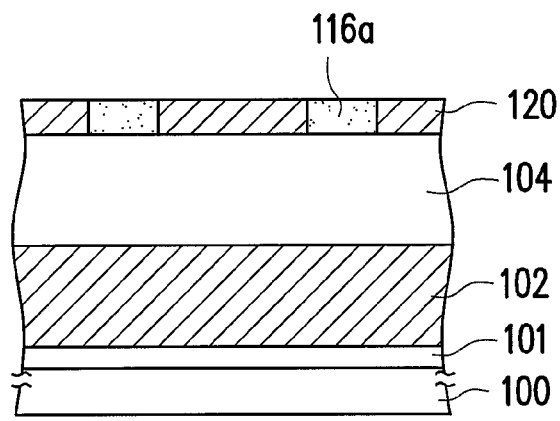

Referring to FIG. 1D, a mask layer 110 is formed to cover the patterned transfer layer 116a. The mask layer 110 includes a silicon-containing material such as polysilicon, and the forming method thereof includes performing a CVD process, for example. Referring to FIG. 1E, a portion of the mask layer 110 is removed to expose the upper surface of patterned transfer layer 116a. The remaining mask layer 110 forms a complementary layer 120 of the patterned transfer layer 116a; that is, the complementary layer 120 is the reverse image of the patterned transfer layer 116a. The method of removing the portion of the mask layer 110 includes performing a chemical mechanical polishing (CMP) process, for example. The polishing selectivity of the mask layer 110 (such as a polysilicon layer) to the patterned transfer layer 116a (such as a SiO$_2$ layer) is between about 100:1 to 200:1, which is high enough so that the CMP process can stop accurately on the upper surface of the patterned transfer layer 116a.

Figure 1F:
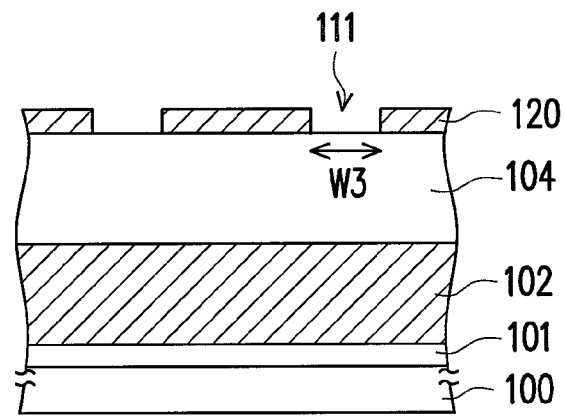

Referring to FIG. 1F, the patterned transfer layer 116a is removed to form an opening 111 in the complementary layer 120, and the width of the opening 111 is W3. The method of removing the patterned transfer layer 116a is a dry plasma etching process, for example.

Figure 1G:
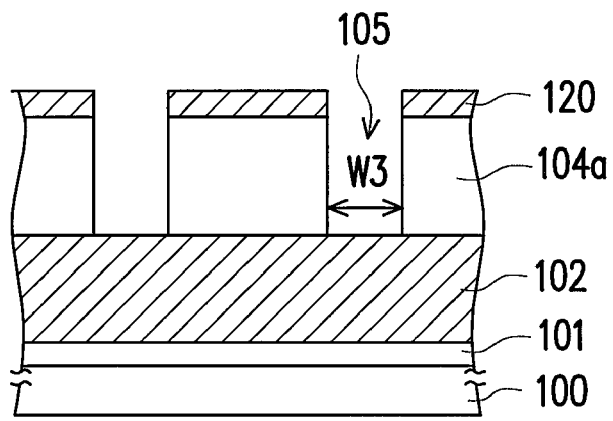

Referring to FIG. 1G, the ashable layer 104 is patterned using the complementary layer 120 as a mask, so as to form a patterned ashable layer 104a. The patterned ashable layer 104a has an opening 105, and the width of the opening 105 is W3. The method of patterning of the ashable layer 104 includes performing an etching process, in which the reaction gas includes Ar and O$_2$, for example. The etching selectivity of the ashable layer 104 (such as an α-C layer) to the complementary layer 120 (such as a polysilicon layer) is between about 15:1 and 35:1, which is high enough so that the patterning process of the ashable layer 104 can be easily achieved with the thin complementary layer 120.

As shown in FIGS. 1D to 1G, the ashable layer 104 is patterned using the complementary layer 120 of the patterned transfer layer 116a as a mask, so as to form the patterned ashable layer 104a.

Figure 1H:
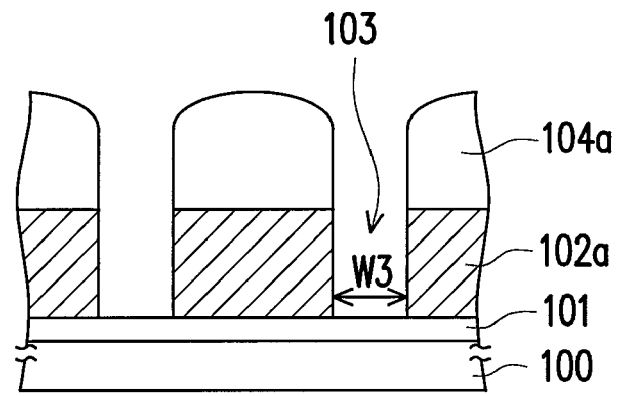

Referring to FIG. 1H, the material layer 102 is patterned using the patterned ashable layer 104a as a mask, so as to form a patterned material layer 102a. The patterned material layer 102a has an opening 103, and the width of the opening 103 is W3. The method of patterning the material layer 102 includes performing an etching process, in which the reaction gas includes HBr, CF$_4$ and O$_2$, for example. The etch selectivity of the material layer 102 (such as a polysilicon layer) to the patterned ashable layer 104a (such as an α-C layer) is greater than about 5, for example, between about 5:1 and 9:1. In this embodiment, the complementary layer 120 and the material layer 102 include the same material such as polysilicon; thus, during the step of patterning the material layer 102, the complementary layer 120 is removed simultaneously, and even a portion of the patterned ashable layer 104a is also removed to form rounding corners. Further, each of the steps in FIGS. 1G to 1H is considered a self-aligned process, so that the width of the opening 111 in the complementary layer 120 is the same as that of the opening 103 in the patterned material layer 102a. That is, the width of the opening 103 is W3.

Figure 1I:
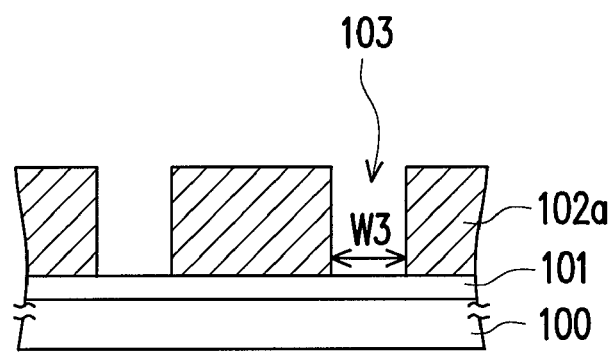

Referring to FIG. 1I, the patterned ashable layer 104a is removed. The method of removing the patterned ashable layer 104a includes performing a dry etching process, such as an oxygen plasma stripe process. Thereafter, a wet etching process is performed to clean the residues of the patterned ashable layer 104a on the patterned material layer 102a.

In view of above, the material layer 102, the ashable layer 104 and the patterned transfer layer 116a are sequentially formed on the substrate 100. Thereafter, the patterns of the complementary layer 120 of the patterned transfer layer 116a are sequentially transferring to the ashable layer 104 and the material layer 102.

Second Embodiment

FIGS. 2A to 2J schematically illustrate, in a cross-sectional view, a patterning method according to the second embodiment of the present invention.

Figure 2A:
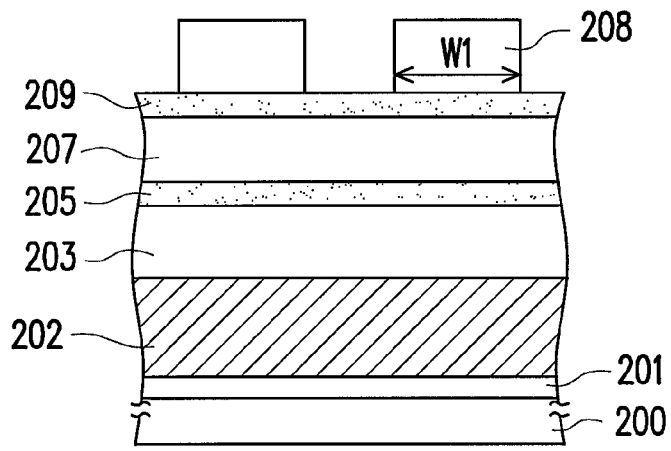
FIGS. 2A to 2I schematically illustrate, in a cross-sectional view, a patterning method according to the second embodiment of the present invention.

Referring to FIG. 2A, a material layer 202, an ashable layer 203, a transfer layer 205, another ashable layer 207, a cap layer 209 and a patterned photoresist layer 208 are sequentially formed on a substrate 200. The substrate 200 may be a silicon substrate. The material layer 202 includes a conductive material. In this embodiment, the material layer 202 includes polysilicon, and the thickness thereof is about 800 Å, for example. The ashable layer 203 includes α-C and the thickness thereof is about 1500 Å, for example. The transfer layer 205 includes SiO$_2$ or SiON, and the thickness thereof is about 500 Å, for example. The ashable layer 207 includes α-C and the thickness thereof is about 500 Å, for example. The cap layer 209 includes SiO$_2$ or SiON, and the thickness thereof is about 300 Å, for example. The method of forming the material layer 202, the ashable layer 203, the transfer layer 205, the ashable layer 207 and the cap layer 209 includes performing a CVD process, for example. The line width of the patterned photoresist layer 208 is W1, and W1 is equal to the exposure limit dimension, for example. Further, a dielectric layer 201 is optionally formed on the substrate 200 before the material layer 202 is formed.

Figure 2B:
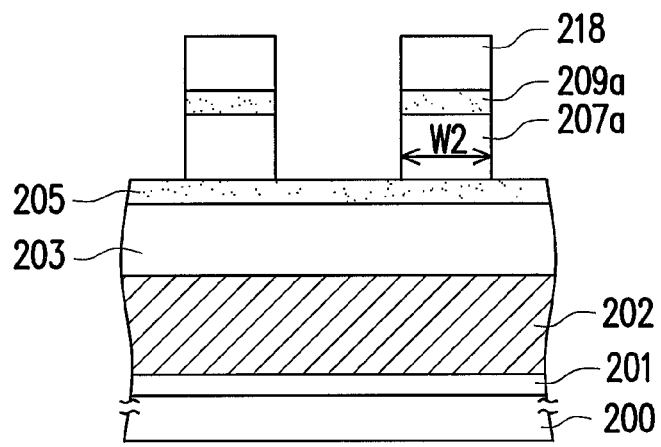

Referring to FIG. 2B, a first trimming process is performed to the patterned photoresist layer 208, so as to form a trimmed patterned photoresist layer 218. Thereafter, the cap layer 209 and the ashable layer 207 are sequentially patterned using the trimmed patterned photoresist layer 218 as a mask, so as to form a patterned cap layer 209a and a patterned ashable layer 207a. The line width of the patterned cap layer 209a and the patterned ashable layer 207a is W2, and W2 is less than the exposure limit dimension. The method of patterning the cap layer 209 and the ashable layer 207 includes performing an etching process, in which the reaction gas includes CF$_4$ and CHF$_3$ for the cap layer 209; the reaction gas includes Ar and O$_2$ for the ashable layer 207, for example.

Figure 2C:
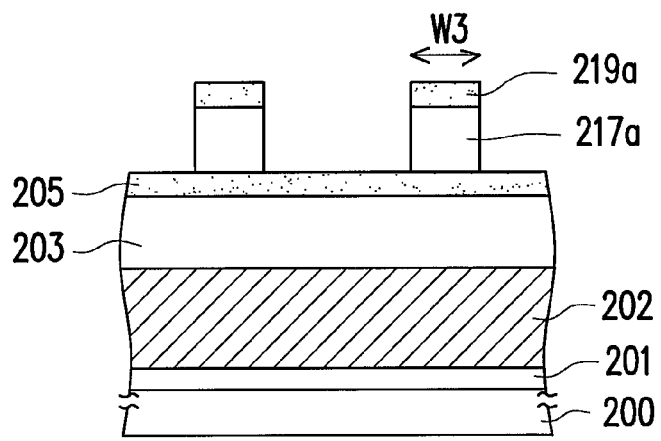

Referring to FIG. 2C, a second trimming process is performed to the patterned cap layer 209a and the patterned ashable layer 207a, so as to form a patterned cap layer 219a and a patterned ashable layer 217a. The line width of the patterned cap layer 219a and the patterned ashable layer 217a is W3. In this step, W2 is trimmed to W3, and W3 is less than the exposure limit dimension. The steps in FIGS. 2B and 2C can be performed in the same chamber. Thereafter, the trimmed patterned photoresist layer is removed. It is noted that either the first trimming process or the second trimming process can be optional. In other words, the patterned cap layer 219a and the patterned ashable layer 217a can be formed by only performing the first trimming process or the second trimming process.

Figure 2D:
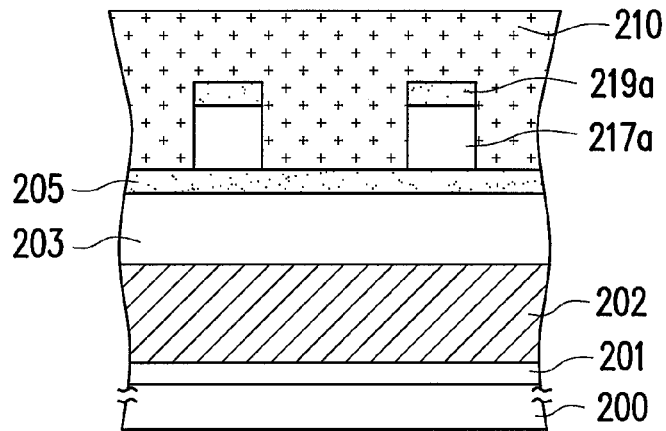

Referring to FIG. 2D, a mask layer 210 is formed to cover the patterned cap layer 219a and the patterned ashable layer 217a. The mask layer 210 includes a silicon-rich material, and the forming method thereof includes performing a spin coating process, for example. In this embodiment, the mask layer 210 includes a silicon polymer with a silicon content of 5-30 wt %, and the thickness thereof is about 1500 Å, for example.

Figure 2E:
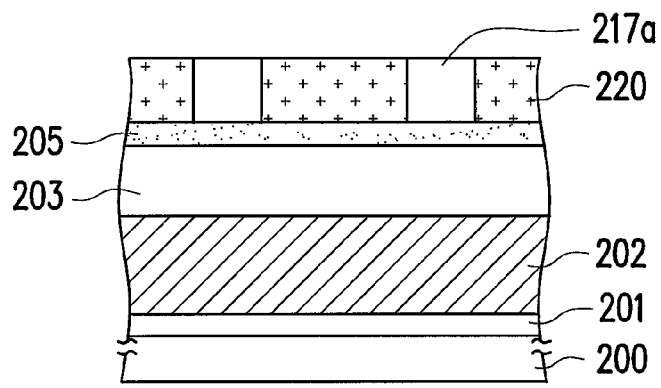

Referring to FIG. 2E, the patterned cap layer 219a and a portion of the mask layer 210 is removed to expose the patterned ashable layer 217a and form a patterned mask layer 220. The patterned mask layer 220 is a complementary layer of the patterned ashable layer 217a. The method of removing the patterned cap layer 219a and the portion of the mask layer 210 includes performing an etching back process, in which the reaction gas includes Ar and $CF_4$, for example.

Figure 2F:
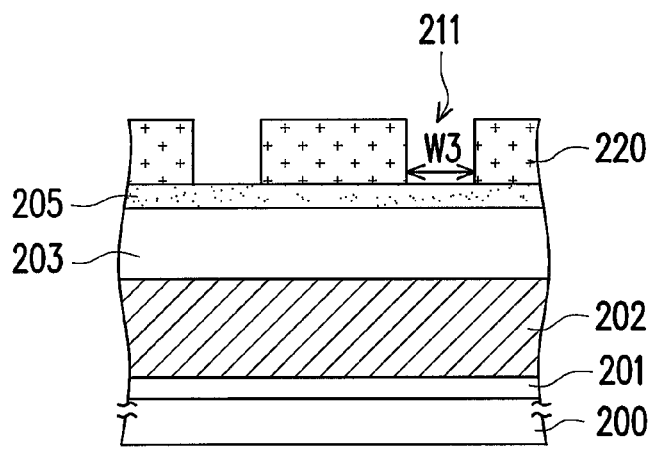

Referring to FIG. 2F, the patterned ashable layer 217a is removed to form an opening 211 in the patterned mask layer 220, and the width of the opening 211 is W3. The method of removing the patterned ashable layer 217a includes performing an etching process, in which the reaction gas includes Ar, $N_2$ and $O_2$, for example.

Figure 2G:
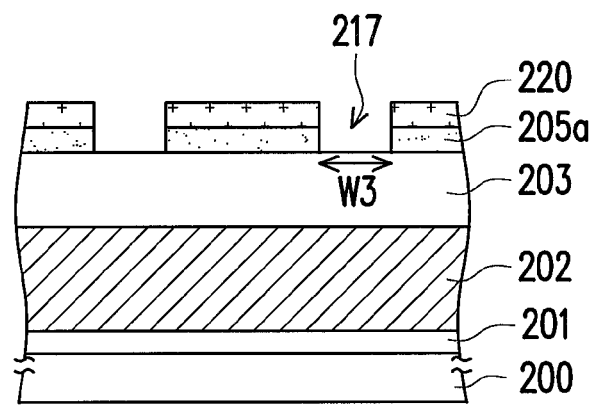

Referring to FIG. 2G, the transfer layer 205 is patterned using the patterned mask layer 220 as a mask, so as to form a patterned transfer layer 205a. The patterned transfer layer 205a has an opening 217, and the width of the opening 217 is W3. The method of patterning the transfer layer 205 includes performing an etching process, in which the reaction gas includes $CF_4$ and $CHF_3$, for example.

As shown in FIGS. 2A to 2G, the material layer 202 and the ashable layer 203 are sequentially formed on the substrate 200, and then the patterned transfer layer 205a is formed on the ashable layer 203.

Figure 2H:
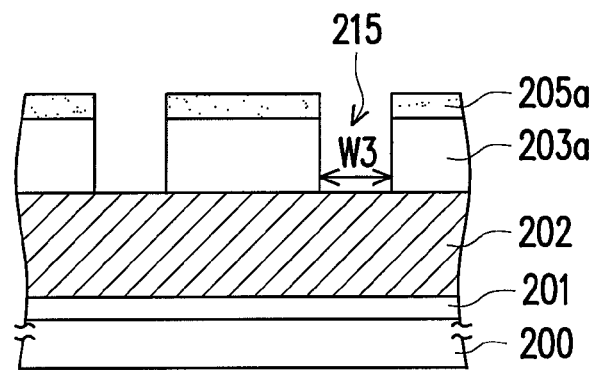

Referring to FIG. 2H, the ashable layer 203 is patterned using the patterned transfer layer 205a as a mask, so as to form a patterned ashable layer 203a. The patterned ashable layer 203a has an opening 215, and the width of the opening 215 is W3. The method of patterning the ashable layer 203 includes performing an etching process, in which the reaction gas includes Ar, $N_2$ and $O_2$, for example. Further, the patterned mask layer 220 is also removed simultaneously during the step of forming the patterned ashable layer 203a.

Figure 2I:
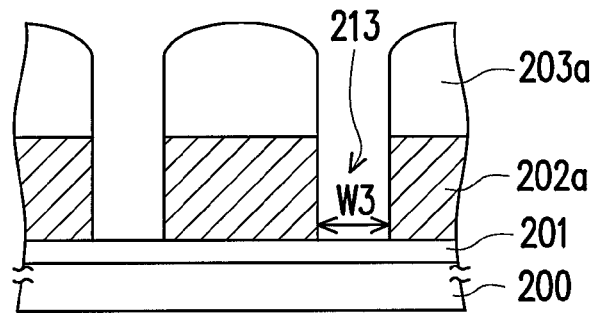

Referring to FIG. 2I, after the patterned ashable layer 203a is formed, a patterned material layer 202a is formed by following the methods described in FIGS. 1H to 1I of the first embodiment; thus, the unnecessary details are not provided.

In view of above, the material layer 202, the ashable layer 203 and the patterned transfer layer 205a are sequentially formed on the substrate 200. Thereafter, the patterns of the patterned transfer layer 205a are sequentially transferring to the ashable layer 203 and the material layer 202.

The present invention is illustrated with the above-mentioned embodiments in which the material layer is for defining a word line, but is not limited thereto. The present invention can be applied to fabricate a contact plug, a via hole or a dual damascene opening. The details will be described in the following.

Third Embodiment

FIGS. 3A to 3E schematically illustrate, in a cross-sectional view, a patterning method according to the third embodiment of the present invention.

Figure 3A:
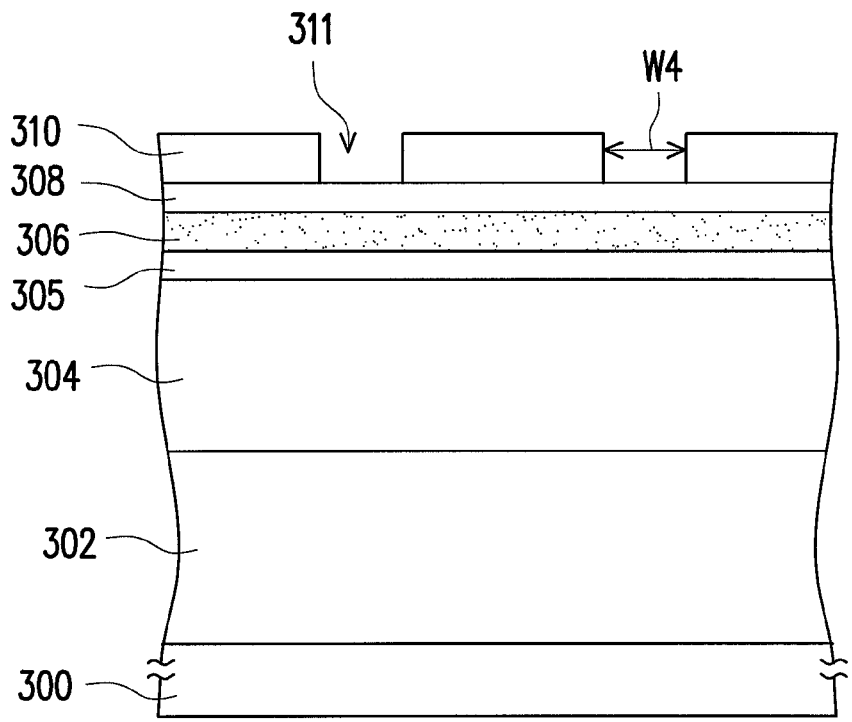
FIGS. 3A to 3E schematically illustrate, in a cross-sectional view, a patterning method according to the third embodiment of the present invention.

Referring to FIG. 3A, a material layer 302, an ashable layer 304, a transfer layer 306 and a patterned photoresist layer 310 are sequentially formed on a substrate 300. The substrate 300 may be a silicon substrate. The material layer 302 includes a dielectric material, for example. In this embodiment, the material layer 302 is an inter-layer dielectric (ILD) oxide layer, and the forming method thereof includes performing a CVD process, for example. The width of the opening 311 in the patterned photoresist layer 310 is W4, and W4 is equal to the exposure limit dimension, for example. In addition, a bottom anti-reflection coating (BARC) layer 308 serving as an anti-reflective light absorber is optionally formed between the transfer layer 306 and the patterned photoresist layer 310. Further, a mask layer 305 is optionally formed between the ashable layer 304 and the transfer layer 306. The mask layer 305 includes silicon or silicon nitride (SiN), and the forming method thereof includes performing a CVD process, for example.

Figure 3B:
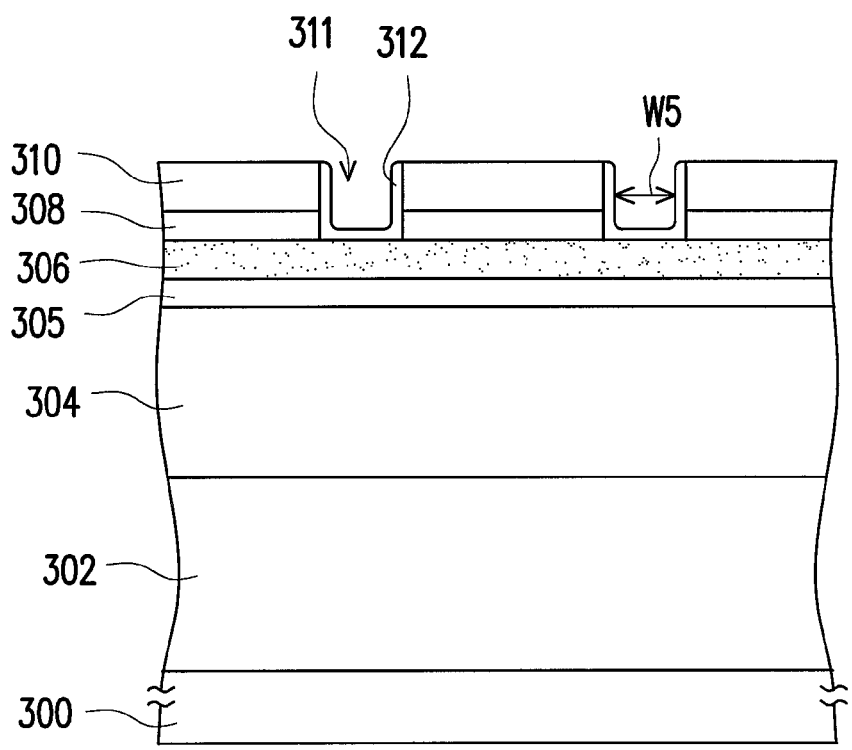

Referring to FIG. 3B, the BARC layer 308 is patterned using the patterned photoresist layer 310 as a mask and polymer 312 is deposited on the sidewall of the patterned photoresist layer 310. That is, the width of the opening 311 in the patterned photoresist layer 310 is reduced from W4 to W5 due to the deposition of the polymer 312; thus, W5 is less than the exposure limit dimension because W4 is equal to the exposure limit dimension. The method of patterning the BARC layer 308 includes performing an etching process, in which the reaction gas includes $CH_4$ and $CH_2F_2$, for example.

Figure 3C:
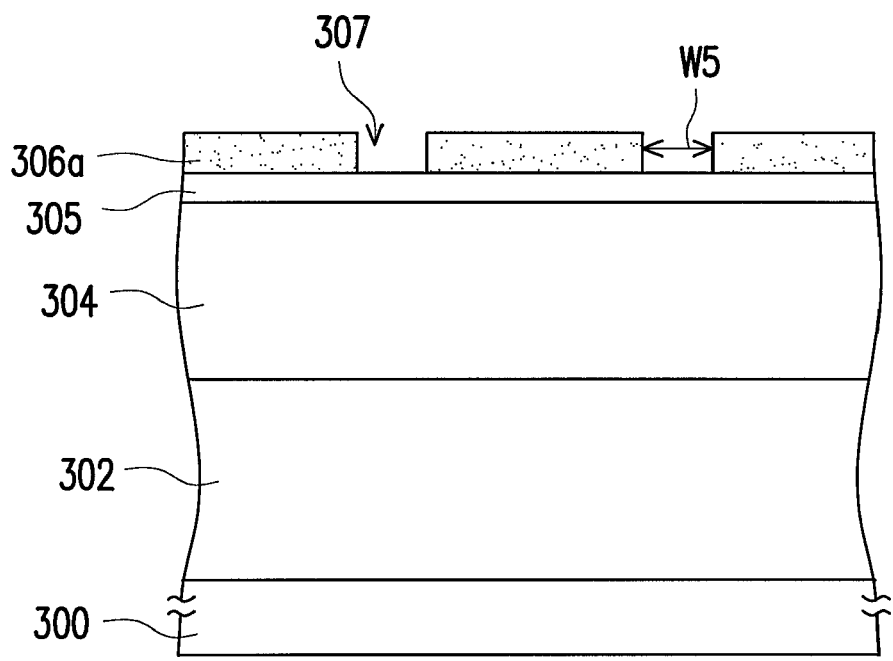

Referring to FIG. 3C, the transfer layer 306 is patterned using the patterned photoresist layer 310 and the polymer 312 as a mask, so as to form a patterned transfer layer 306a. The patterned transfer layer 306a has an opening 307, and the width of the opening is W5. The method of patterning the transfer layer 306 includes performing an etching process, in which the reaction gas includes $CH_4$ and $CH_2F_2$, for example. The steps in FIGS. 3B and 3C can be performed in the same chamber. Thereafter, the BARC layer 308, the patterned photoresist layer 310 and the polymer 312 are removed.

Figure 3D:
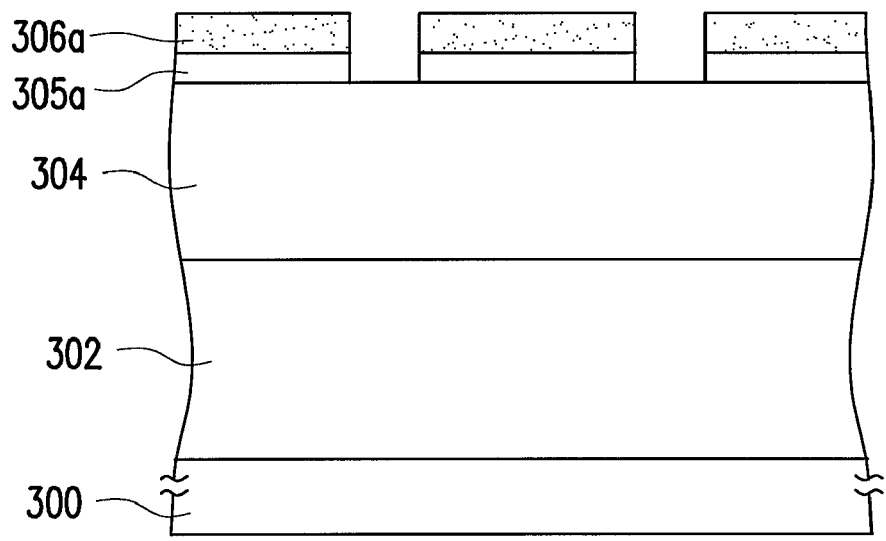
Figure 3E:
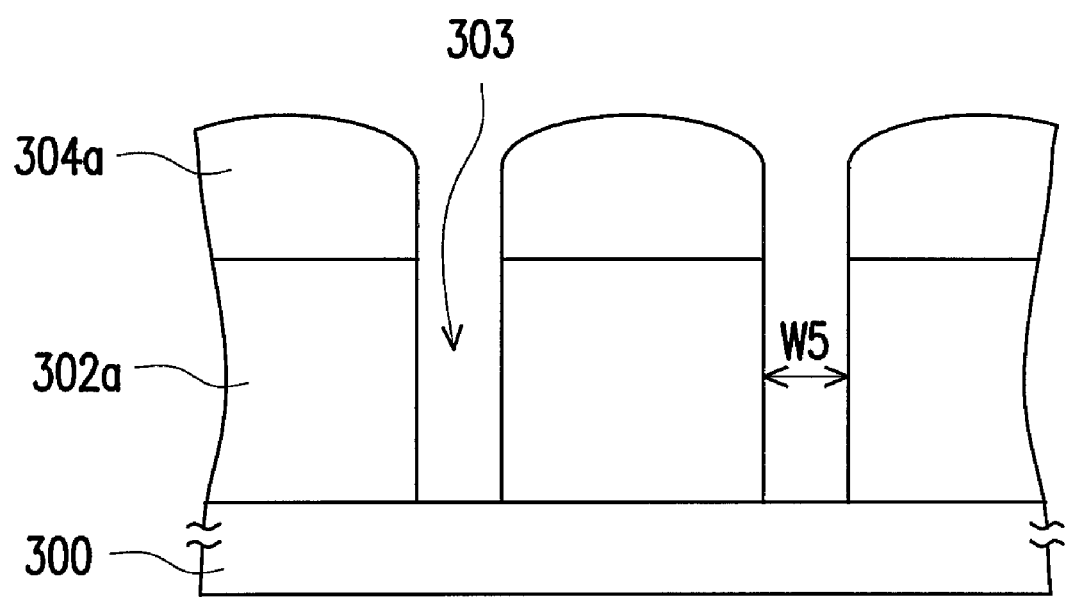

Referring to FIG. 3D, the mask layer 305 is patterned using the patterned transfer layer 306a as a mask, so as to form a patterned mask layer 305a. Referring to FIG. 3E, the ashable layer 304 is patterned using the patterned mask layer 305a as a mask, so as to form a patterned ashable layer 304a. The patterned transfer layer 306a may be also removed simultaneously during the step of patterning the ashable layer 304. Afterwards, the material layer 302 is patterned using the patterned ashable layer 304a as a mask, so as to form a patterned material layer 302a having an opening 303. The patterned mask layer 305a may be also removed simultaneously during the step of patterning the material layer 302. Further, the patterned ashable layer 304a is removed. The above-mentioned steps in FIGS. 3D and 3E can be performed in the same chamber. In addition, each step in FIGS. 3D and 3E is considered a self-aligned process, so that the width of the opening 303 in the patterned material layer 302a is the same as that of the opening 307 in the patterned transfer layer 306a. That is, the width of the opening 303 is W5.

In view of above, the material layer 302, the ashable layer 304 and the patterned transfer layer 306a are sequentially formed on the substrate 300. Thereafter, the patterns of the patterned transfer layer 306a are sequentially transferring to the ashable layer 304 and the material layer 302.

The third embodiment in which the material layer only has the array area is provided for illustration purposes and is not construed as limiting the present invention. It is appreciated by persons skilled in the art that the material layer can have the array area and the periphery area at the same time.

Fourth Embodiment

FIGS. 4A to 4F schematically illustrate, in a cross-sectional view, a patterning method according to the fourth embodiment of the present invention. The fourth embodiment is similar to the third embodiment. The difference between them is that the transfer layer 306 is patterned twice in the fourth embodiment, so that the pattern density of the fourth embodiment is two times that of the third embodiment.

Figure 4A:
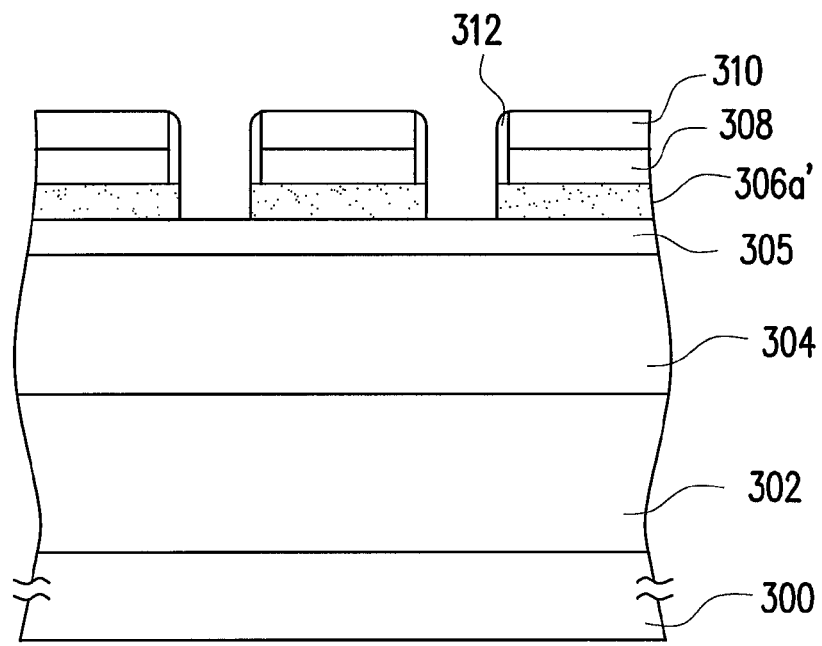
FIGS. 4A to 4F schematically illustrate, in a cross-sectional view, a patterning method according to the fourth embodiment of the present invention.
Figure 4B:
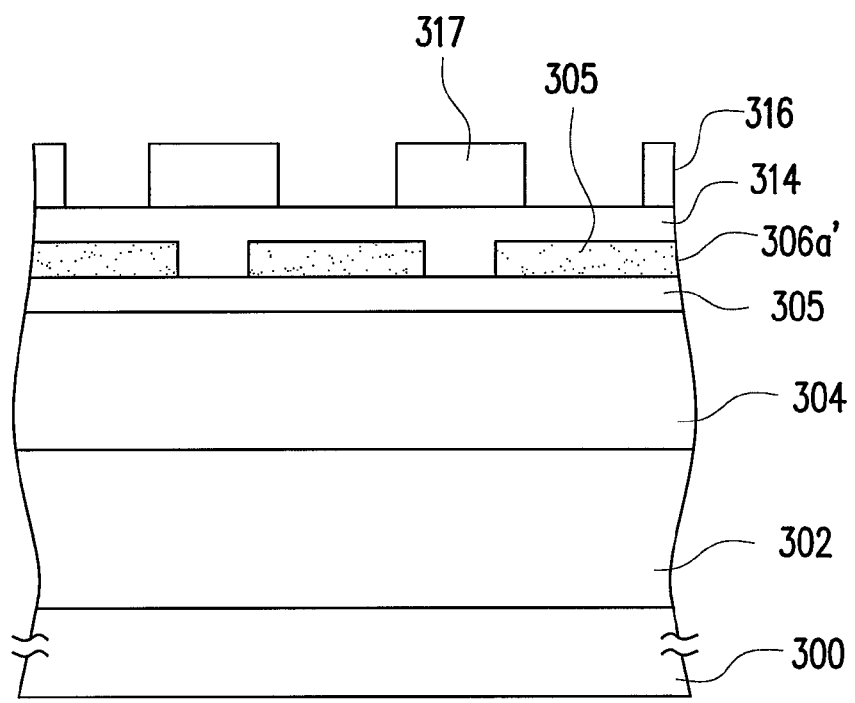

The structure of FIG. 3B is provided first. Thereafter, referring to FIG. 4A, the BARC layer 308 is patterned using the patterned photoresist layer 310 as a mask and polymer 312 is deposited on the sidewall of the patterned photoresist layer 310. Afterwards, the transfer layer 306 is patterned using the patterned photoresist layer 310 and the polymer 312 as a mask, so as to form a patterned intermediate layer 306a'. The patterned photoresist layer 310, the BARC layer 308 and the polymer 312 are then removed. Referring to FIG. 4B, a BARC layer 314 and a patterned photoresist layer 316 are sequentially formed on the patterned intermediate layer 306a'. The patterns 317 of the patterned photoresist layer 316 and the patterns 305 of the patterned intermediate layer 306a' are alternately arranged.

Figure 4C:
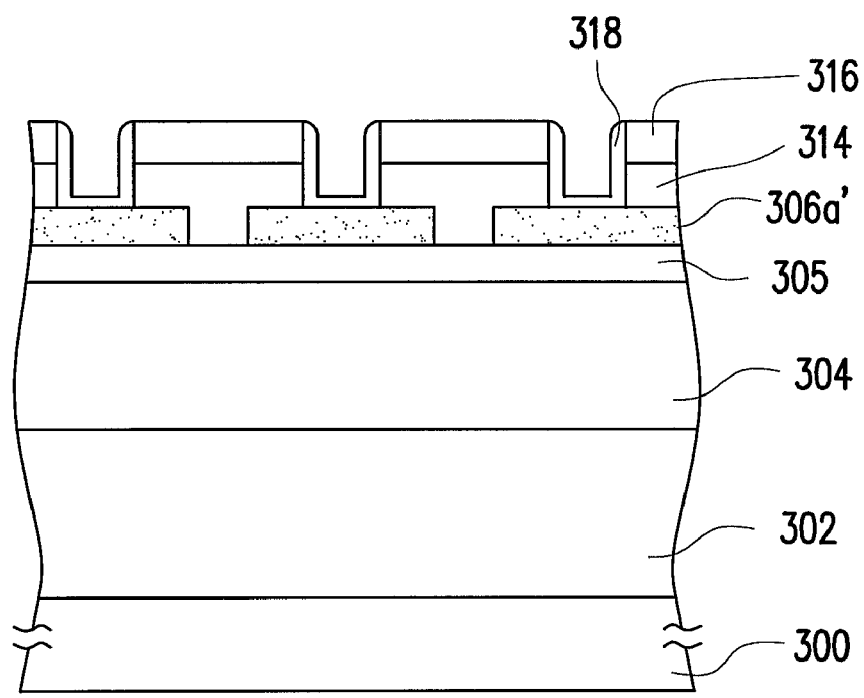
Figure 4D:
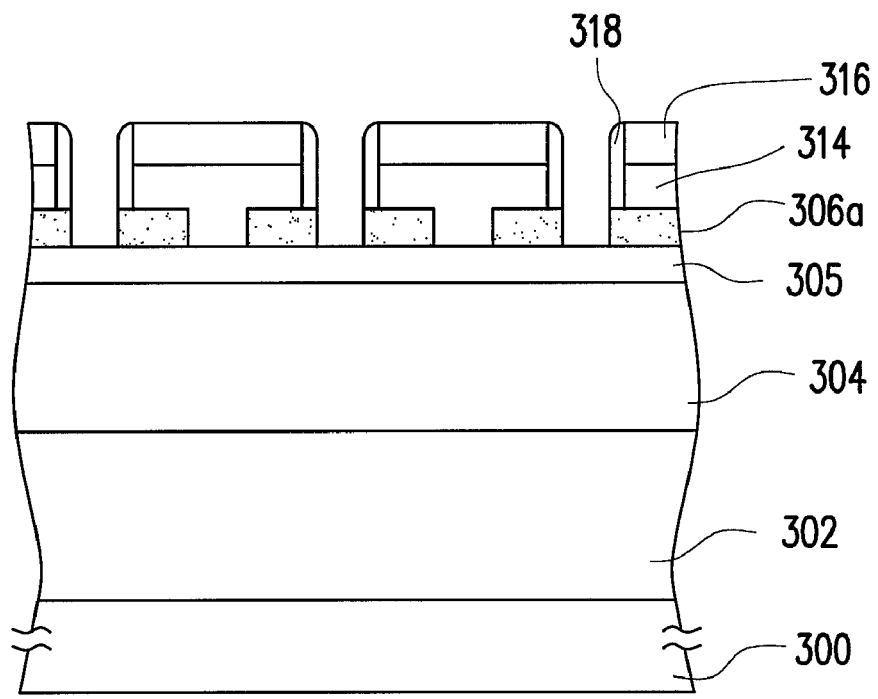

Referring to FIG. 4C, the BARC layer 314 is patterned using the patterned photoresist layer 316 as a mask and polymer 318 is deposited on the sidewall of the patterned photoresist layer 316. Referring to FIG. 4D, the patterned intermediate layer 306a' are patterned using the patterned photoresist layer 316 and the polymer 318 as a mask, so as to form a patterned transfer layer 306a. The step in FIGS. 4C and DD can be performed in the same chamber. Thereafter, the patterned photoresist layer 316, the BARC layer 314 and the polymer 318 are removed.

Figure 4E:
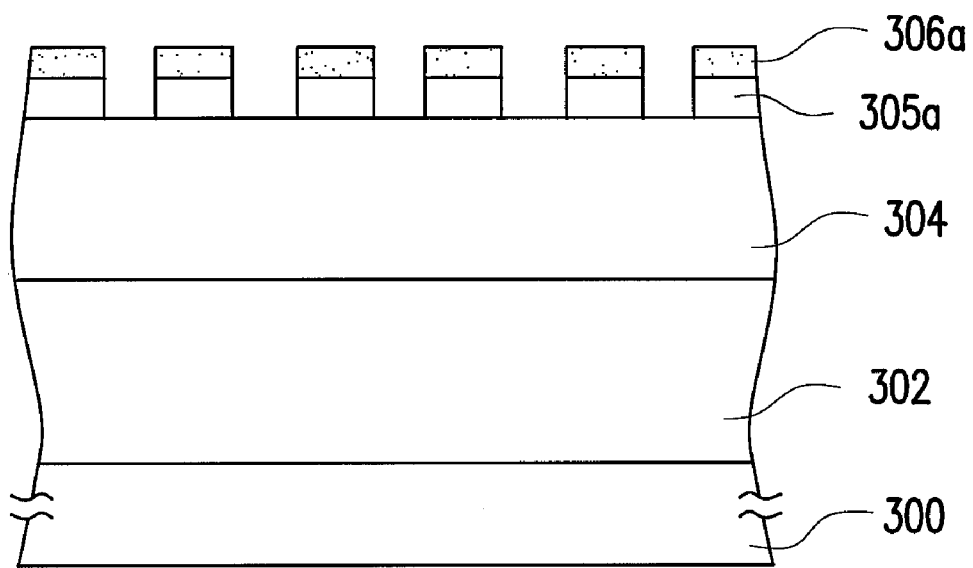
Figure 4F:
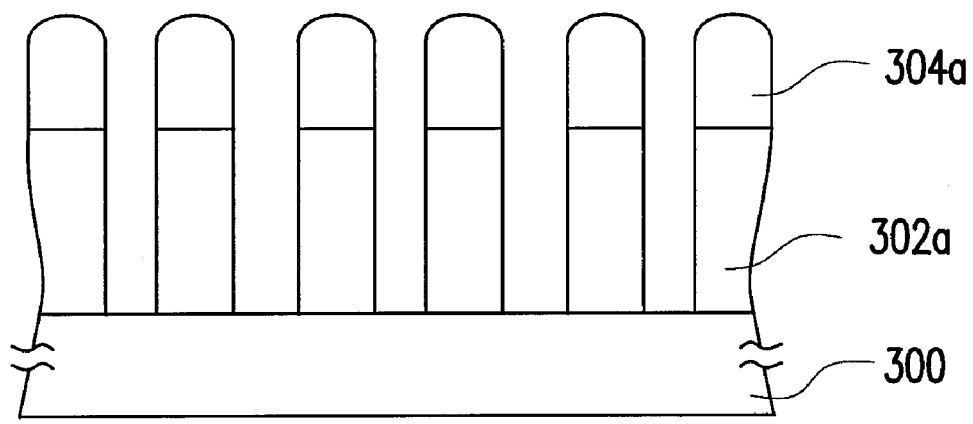

Referring to FIG. 4E, the mask layer 305 is patterned using the patterned transfer layer 306a as a mask, so as to form a patterned mask layer 305a. Referring to FIG. 4F, after the patterned mask layer 305a is formed, a patterned material layer 302a is formed by following the methods described in FIG. 3E of the third embodiment; thus, the unnecessary details are not provided.

Fifth Embodiment

FIGS. 5A to 5I schematically illustrate, in a cross-sectional view, a patterning method according to the fifth embodiment of the present invention.

Figure 5A:
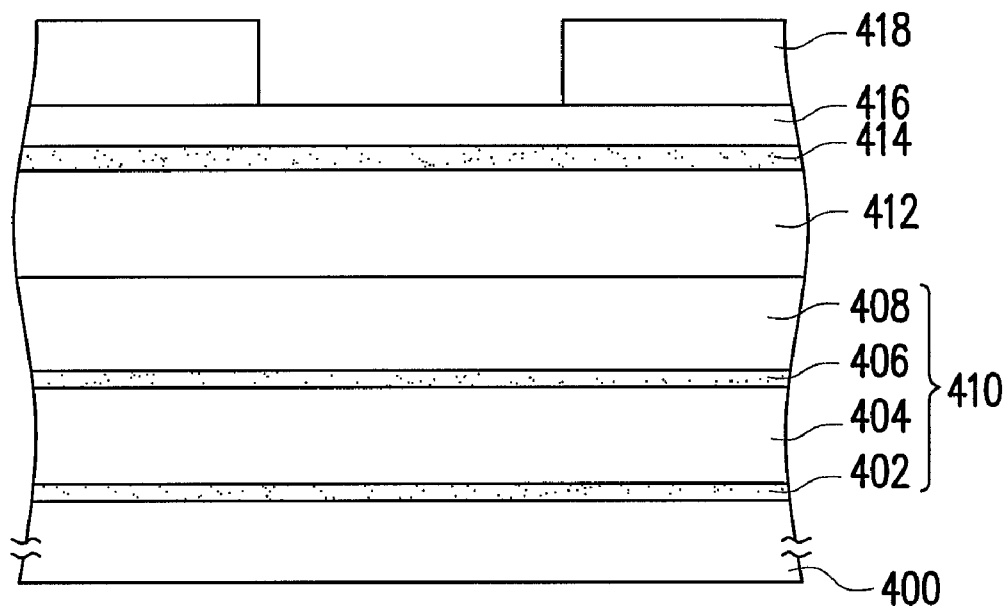
FIGS. 5A to 5I schematically illustrate, in a cross-sectional view, a patterning method according to the fifth embodiment of the present invention.

Referring to FIG. 5A, a material layer 410 including, from bottom to top, a stopping layer 402, a dielectric layer 404, another stopping layer 406 and another dielectric layer 408 on a substrate 400. The substrate 400 may be a conductive substrate, and the material thereof includes Cu, AlCu or W for example. The stopping layers 402 and 406 include SiN or SiON, and the forming method thereof includes performing a CVD process, for example. The dielectric layers 404 and 408 include $SiO_2$, and the forming method thereof includes performing a CVD process, for example. Thereafter, an ashable layer 412, a transfer layer 414, a BARC layer 416 and a patterned photoresist layer 418 are sequentially formed on the material layer 410. The ashable layer 412 includes α-C, and the forming method thereof includes performing a CVD process, for example. The transfer layer 414 includes $SiO_2$ or SiON, and the forming method thereof includes performing a CVD process, for example.

Figure 5B:
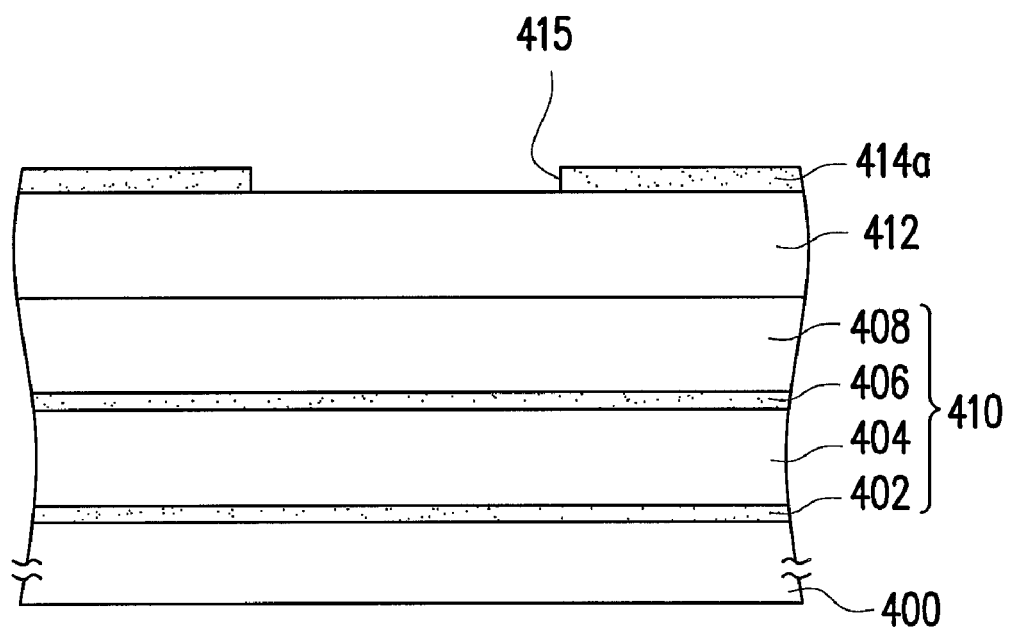

Referring to FIG. 5B, the BARC layer 416 and the transfer layer 414 are sequentially patterned using the patterned photoresist layer 418 as a mask, so as to form a patterned transfer layer 414a having an opening pattern 415. The method of sequentially patterning the BARC layer 416 and the transfer layer 414 includes performing an etching process, in which the reaction gas includes $CF_4$ and $O_2$, for example. Thereafter, the BARC layer 416 and the patterned photoresist layer 418 are removed.

Figure 5C:
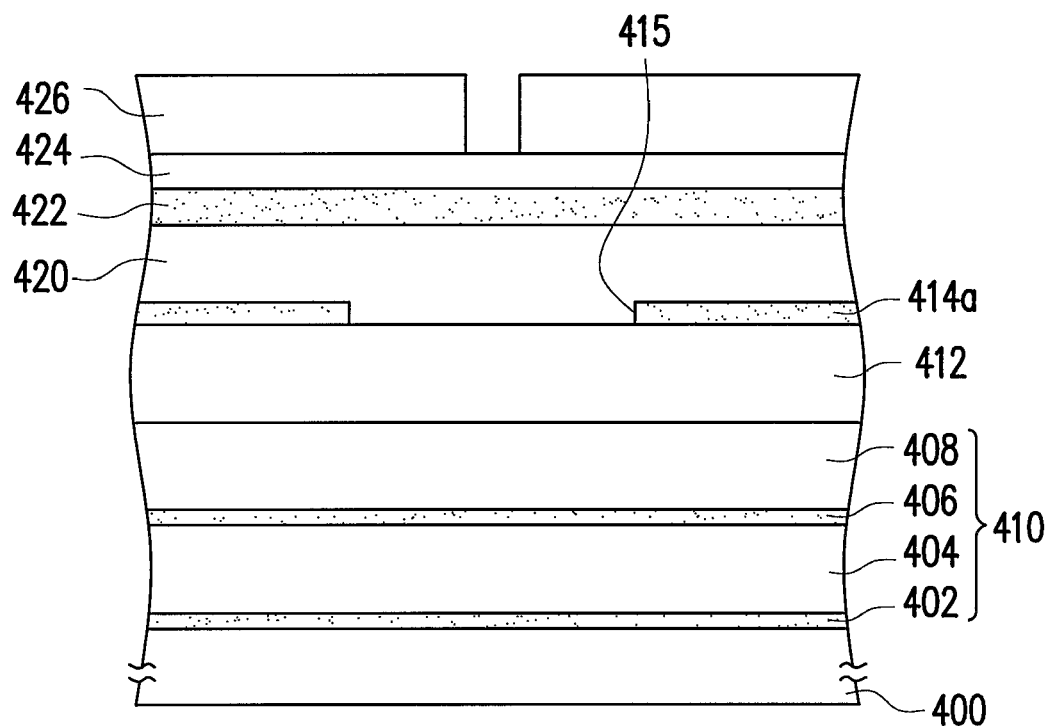

Referring to FIG. 5C, an ashable layer 420, a transfer layer 422, a BARC layer 424 and a patterned photoresist layer 426 are sequentially formed on the patterned transfer layer 414a. The ashable layer 420 includes α-C, and the forming method thereof includes performing a CVD process, for example. The transfer layer 422 includes $SiO_2$ or SiON, and the forming method thereof includes performing a CVD process, for example.

Figure 5D:
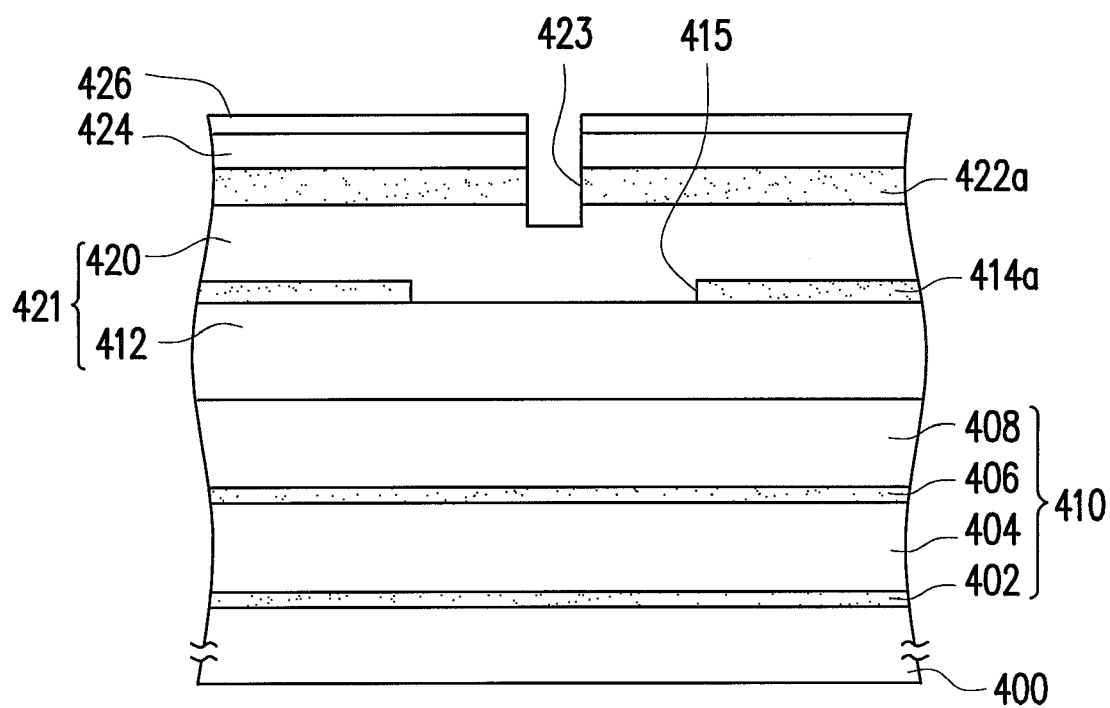

Referring to FIG. 5D, the BARC layer 424 and the transfer layer 422 are sequentially patterned using the patterned photoresist layer 426 as a mask, so as to form a patterned transfer layer 422a having an opening pattern 423. The method of sequentially patterning the BARC layer 424 and the transfer layer 422 includes performing an etching process, in which the reaction gas includes $CF_4$ and $O_2$, for example. As described in the third embodiment, the polymer deposition on the sidewall of the patterned photoresist layer 426 may occur during the step of patterning the BARC layer 424, so that the opening width of the patterned photoresist layer 426 can be reduced to less than an exposure limit dimension. Accordingly, the width of the opening pattern 423 of the patterned transfer layer 422a is also less than the exposure limit dimension.

Figure 5E:
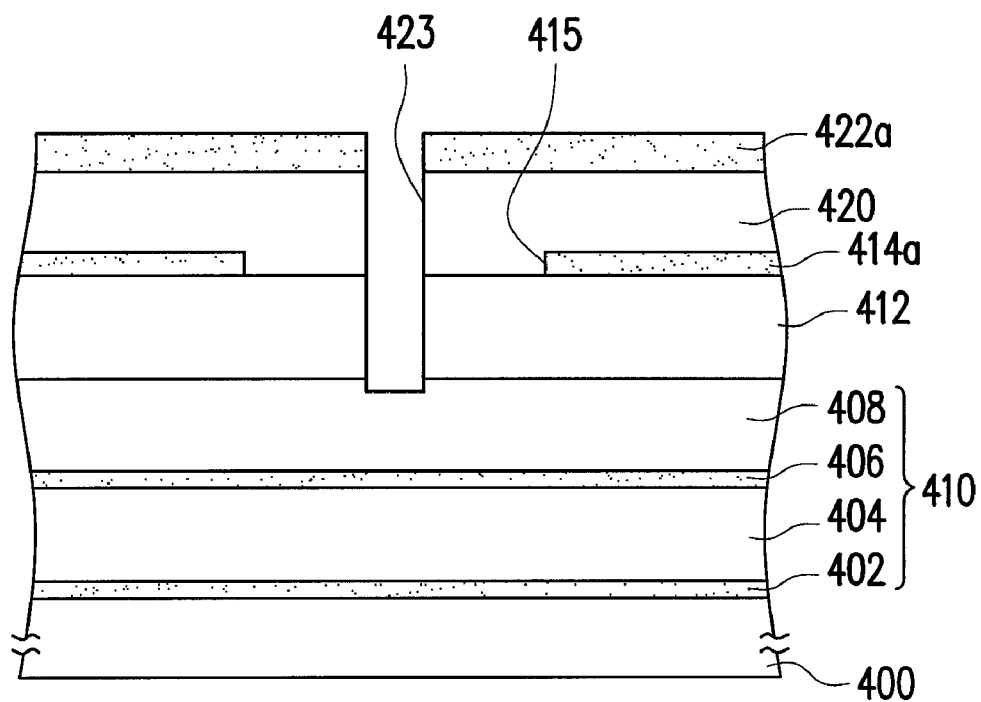

As shown in FIGS. 5A to 5D, an ashable structure 421 including, from bottom to top, the ashable layer 412 and the ashable layer 420 is formed on the material layer 410, and then the patterned transfer layer 422a is formed on the ashable structure 421. Referring to FIG. 5E, a portion of the ashable layer 420 and a portion of the ashable layer 412 are sequentially removed using the patterned transfer layer 422a as a mask, so as to transfer the opening pattern 423 to the ashable layer 420 and the ashable layer 412. The method of sequentially removing the portion of the ashable layer 420 and the portion of the ashable layer 412 includes performing an etching process, in which the reaction gas includes $O_2$ and Ar, for example.

Figure 5F:
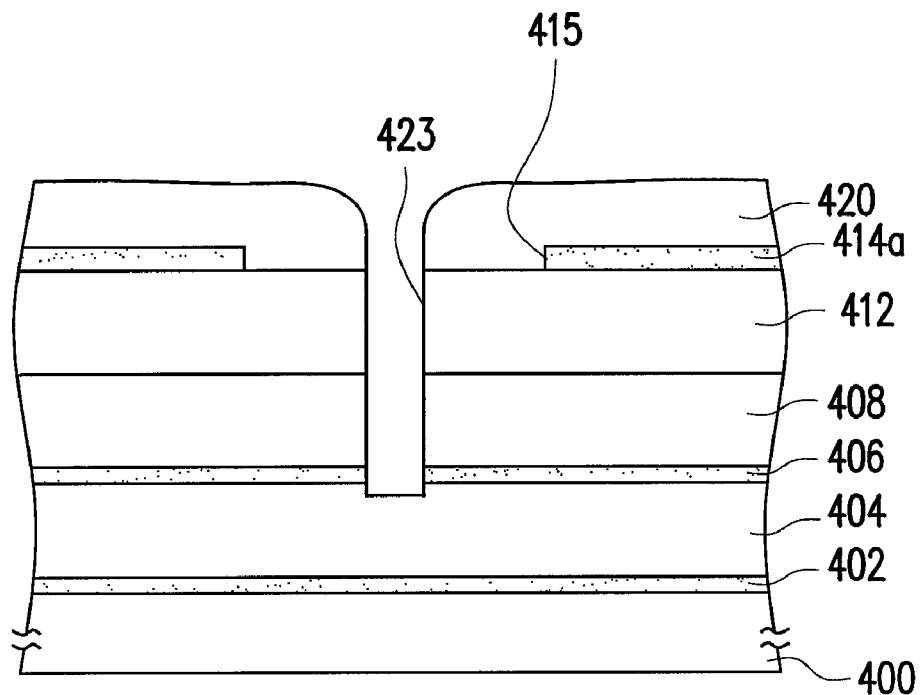

Referring to FIG. 5F, a portion of the dielectric layer 408 and a portion of the stopping layer 406 are sequentially removed using the ashable layer 420 as a mask, so as to transfer the opening pattern 423 to the dielectric layer 408 and the stopping layer 406. The method of sequentially removing the portion of the dielectric layer 408 and the portion of the stopping layer 406 includes performing an etching process, in which the reaction gas includes $C_5F_8$, Ar and $O_2$ for the dielectric layer 408; the reaction gas includes $CHF_3$, $CH_2F_2$, $O_2$ and Ar for the stopping layer 406, for example.

Figure 5G:
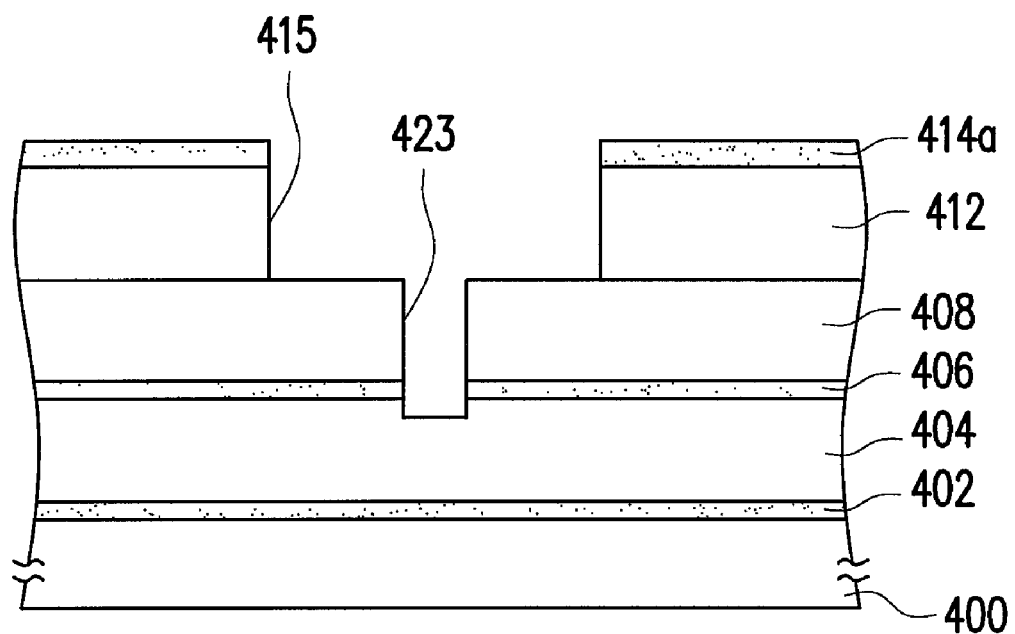

Referring to FIG. 5G; a portion of the ashable layer 412 is removed using the patterned transfer layer 414a as a mask, so as to transfer the opening pattern 415 to the ashable layer 412. The method of removing the portion of the ashable layer 412 includes performing an etching process, in which the reaction gas includes $O_2$ and Ar, for example.

Figure 5H:
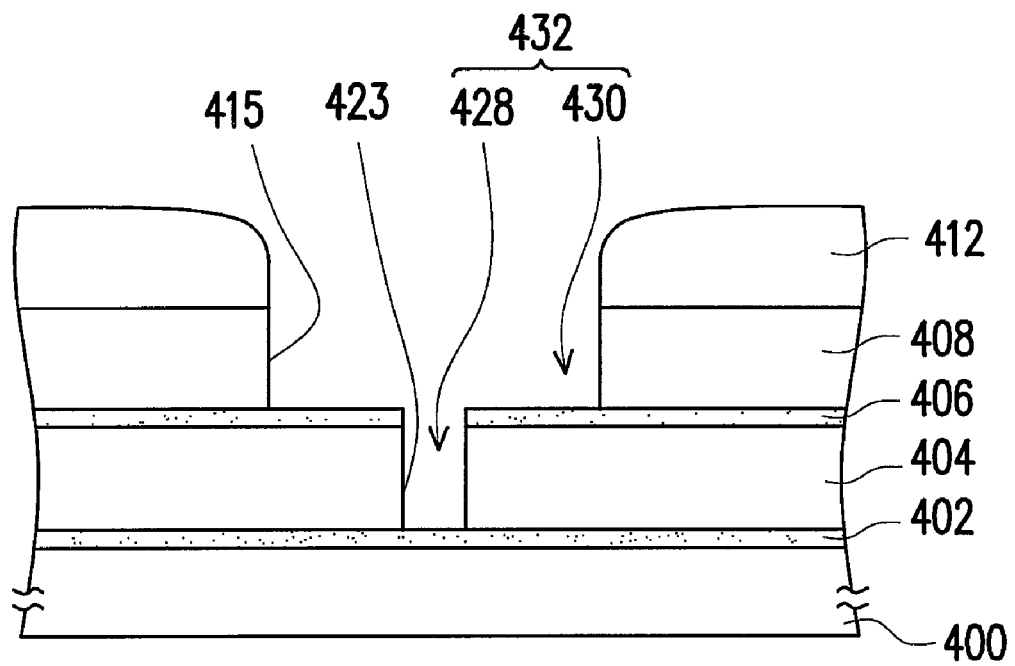

Referring to FIG. 5H, a portion of the dielectric layer 408 and a portion of the dielectric layer 404 are removed using the ashable layer 412 having the opening pattern 415 as a mask, so as to form a damascene opening 432. In details, the opening pattern 415 is transferred to the dielectric layer 408, so as to form an opening 430 in the dielectric layer 408. The opening pattern 423 is transferred to the dielectric layer 404, so as to form an opening 428 in the dielectric layer 404. The step of removing the portion of the dielectric layer 408 and the portion of the dielectric layer 404 stops on the stopping layer 406 and the stopping layer 402, for example. Further, the method of removing the portion of the dielectric layer 408 and the portion of the dielectric layer 404 includes performing an etching process, in which the reaction gas includes $C_5F_8$, Ar and $O_2$, for example. In addition, the patterned transfer layer 414a may be also simultaneously removed during the step of removing the portion of the dielectric layer 408 and the portion of the dielectric layer 404.

Figure 5I:
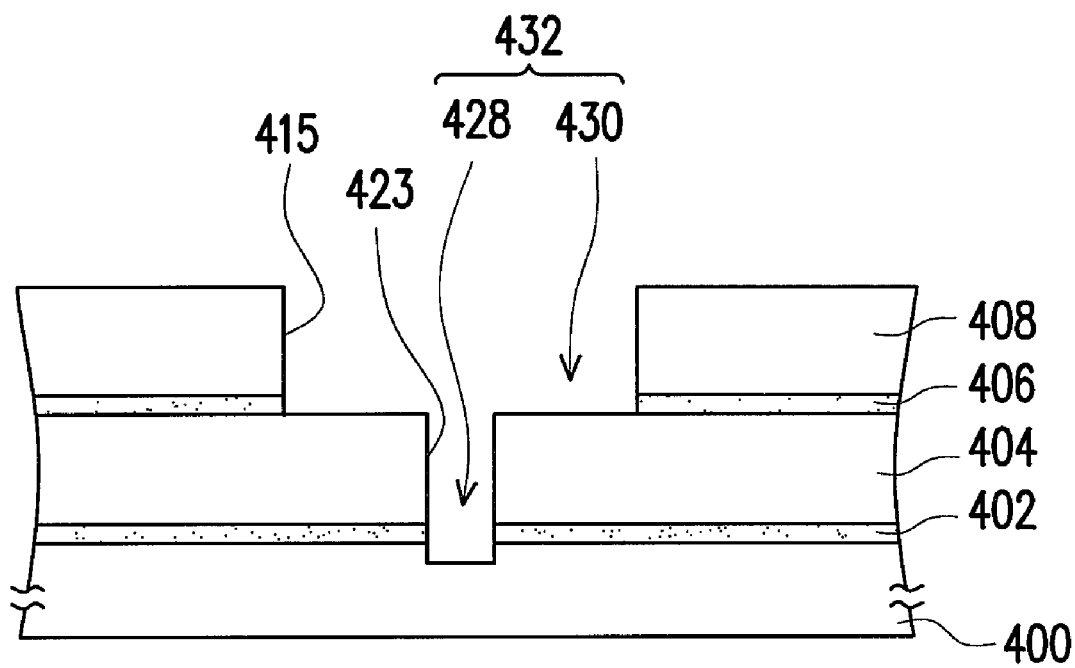

Referring to FIG. 5I, the stopping layer 406 and the stopping layer 402 exposed by the dual damascene opening 432 are removed. The method of removing the stopping layer 406 and the stopping layer 402 exposed by the dual damascene opening 432 includes performing an etching process, in which the reaction gas includes $CHF_3$, $CH_2F_2$, $O_2$ and Ar, for example. Thereafter, the ashable layer 412 is removed by performed an $O_2$ plasma ashing process, for example. It is noted that the steps in FIGS. 5D to 5I can be performed as a self-aligned process in the same chamber, so that the fabrication process is very simple and quick.

As shown in FIGS. 5E to 5I, the ashable structure 421 is patterned using the patterned transfer layer 414a and the patterned transfer layer 422a as a mask, and then the material layer 410 is patterned using the patterned ashable structure as a mask, so as to form a dual damascene opening 432 in the material layer 410. The dual damascene opening 432 includes the opening 428 and the opening 430. The opening 428 is in the stopping layer 402 and the dielectric layer 404, and the opening 430 is in the stopping layer 406 and the dielectric layer 408. The opening 428 is right below the opening 430, and the width of the opening 428 is smaller than that of the opening 430.

In this embodiment, the dimension of the dual damascene opening 432 is decided by the widths of the opening patterns 415 and 423, so that the overlay measurement between the opening pattern 415 and the opening pattern 423 can be obtained before forming the dual damascene opening 432. If the overlay measurement is out of request, the ashable structure 421, the patterned transfer layer 414a and the patterned transfer layer 422a can be reworked and re-patterned with few process steps.

In summary, according to the method of the present invention, a patterned material layer having a critical dimension less than the exposure limit dimension can be fabricated with the existing manufacturing equipment.

When the present invention is applied to fabricate a word line of a non-volatile memory, a wider word line can be fabricated at the same pitch because the device opening can be reduced in accordance with the method of the present invention. Thus, the short channel effects are avoided at the same device density, and the performance of the device is enhanced.

Moreover, the patterning method of the present invention can be applied to fabricate a smaller contact plug or via hole, so that the pattern density can be increased by up to two times without replacing existing machines and photoresists, thus, the cost is greatly reduced and the competitiveness is significantly improved.

Further, the patterning method of the present invention allows a wider process window to fabricate a self-aligned dual damascene opening. The overlay requirement of the dual damascene opening can be confirmed before forming the dual damascene opening, so that a misalignment issue can be obviated accordingly.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A patterning method, comprising:
    forming a material layer on a substrate;
    forming a first ashable layer on the material layer;
    forming a patterned first transfer layer on the first ashable layer, wherein the patterned first transfer layer has a critical dimension less than an exposure limit dimension;
    patterning the first ashable layer using a complementary layer of the patterned first transfer layer as a mask, so as to form a patterned first ashable layer, wherein the complementary layer and the patterned first transfer layer are not stacked on top of each other, and the complementary layer is a reverse image of the patterned first transfer layer, and wherein the first ashable layer comprises amorphous carbon and the complementary layer comprises polysilicon; and
    patterning the material layer using the patterned first ashable layer as a mask.

2. The method of claim 1, wherein the step of forming the patterned first transfer layer comprises:
    sequentially forming a first transfer layer and a patterned photoresist layer on the first ashable layer;
    performing a first trimming process to the patterned photoresist layer, so as to form a trimmed patterned photoresist layer; and
    patterning the first transfer layer using the trimmed patterned photoresist layer as a mask.

3. The method of claim 1, wherein the step of forming the patterned first transfer layer further comprises performing a trimming process to the patterned first transfer layer.

4. The method of claim 1, wherein the step of forming the patterned first ashable layer comprises:
    forming a mask layer to cover the patterned first transfer layer;
    removing a portion of the mask layer to expose a top of the patterned first transfer layer;
    removing the patterned first transfer layer to form the complementary layer of the patterned first transfer layer; and
    patterning the first ashable layer using the complementary layer of the patterned first transfer layer as a mask.

5. The method of claim 1, wherein the step of forming the patterned first transfer layer comprises:
    sequentially forming a first transfer layer, a second ashable layer, a cap layer and a patterned photoresist layer on the first ashable layer;
    performing a first trimming process to the patterned photoresist layer, so as to form a trimmed patterned photoresist layer;
    sequentially patterning the cap layer and the second ashable layer using the trimmed patterned photoresist layer as a mask, so as to form a patterned cap layer and a patterned second ashable layer;
    forming a mask layer to cover the patterned cap layer and the patterned second ashable layer;
    removing the patterned cap layer and a portion of the mask layer;
    removing the patterned second ashable layer to form a patterned mask layer; and
    patterning the first transfer layer using the patterned mask layer as a mask.

6. The method of claim 5, wherein the second ashable layer comprises amorphous carbon.

7. The method of claim 1, wherein the step of forming the patterned first transfer layer comprises:
    sequentially forming a first transfer layer and a patterned photoresist layer on the first ashable layer;
    depositing polymer on a sidewall of the patterned photoresist layer; and patterning the first transfer layer using the patterned photoresist layer and the polymer as a mask; and removing the patterned photoresist layer and the polymer.

8. The method of claim 1, wherein the first ashable layer is a ashable structure comprising a bottom ashable layer and a top ashable layer, and the patterned first transfer layer is formed on the top ashable layer.

9. The method of claim 8, further comprising forming a patterned second transfer layer between the bottom ashable layer and the top ashable layer,
- wherein a critical dimension of the patterned second transfer layer is greater than the critical dimension of the patterned first transfer layer;
- wherein the step of patterning the first ashable layer comprises removing a portion of the bottom ashable layer and a portion of the top ashable layer, using the patterned first transfer layer and the patterned second transfer layer as a mask, so as to form a patterned ashable structure; and
- wherein the step of patterning the material layer comprises removing a portion of the material layer using the patterned ashable structure as a mask, so as to form a dual damascene opening in the material layer.

10. A patterning method, comprising:
- sequentially forming a material layer, a first ashable layer and a patterned first transfer layer on a substrate; and
- sequentially transferring patterns of a complementary layer of the patterned first transfer layer to the first ashable layer and the material layer, wherein the complementary layer and the patterned first transfer layer are not stacked on top of each other, and the complementary layer is a reverse image of the patterned first transfer layer, and wherein the first ashable layer comprises amorphous carbon and the complementary layer comprises polysilicon.

11. The method of claim 10, where the step of forming the patterned first transfer layer comprises:
- sequentially forming a first transfer layer and a patterned photoresist layer on the first ashable layer;
- performing a first trimming process to the patterned photoresist layer, so as to form a trimmed patterned photoresist layer; and
- patterning the first transfer layer using the trimmed patterned photoresist layer as a mask.

12. The method of claim 10, wherein the step of sequentially transferring the patterns of the patterned first transfer layer or the patterns of the complementary layer of the patterned first transfer layer to the first ashable layer and the material layer comprises:
- patterning the first ashable layer using the patterned first transfer layer or the complementary layer of the patterned first transfer layer as a mask, so as to form a patterned first ashable layer; and
- patterning the material layer using the patterned first ashable layer as a mask.

13. The method of claim 12, wherein the step of forming the patterned first ashable layer comprises:
- forming a mask layer to cover the patterned first transfer layer;
- removing a portion of the mask layer to expose a top of the patterned first transfer layer;
- removing the patterned first transfer layer to form the complementary layer of the patterned first transfer layer; and
- patterning the first ashable layer using the complementary layer of the patterned first transfer layer as a mask.

14. The method of claim 10, wherein the step of forming the patterned first transfer layer comprises:
- sequentially forming a first transfer layer, a second ashable layer, a cap layer and a patterned photoresist layer on the first ashable layer;
- performing a first trimming process to the patterned photoresist layer, so as to form a trimmed patterned photoresist layer;
- sequentially patterning the cap layer and the second ashable layer using the trimmed patterned photoresist layer as a mask, so as to form a patterned cap layer and a patterned second ashable layer;
- forming a mask layer to cover the patterned cap layer and the patterned second ashable layer;
- removing the patterned cap layer and a portion of the mask layer;
- removing the patterned second ashable layer to form a patterned mask layer; and
- patterning the first transfer layer using the patterned mask layer as a mask.

15. The method of claim 14, wherein the second ashable layer comprises amorphous carbon.

16. The method of claim 10, wherein the step of forming the patterned first transfer layer comprises:
- sequentially forming a first transfer layer and a patterned photoresist layer on the first ashable layer;
- depositing polymer on a sidewall of the patterned photoresist layer; and
- patterning the first transfer layer using the patterned photoresist layer and the polymer as a mask; and
- removing the patterned photoresist layer and the polymer.

17. The method of claim 10, wherein the first ashable layer is a ashable structure comprising a bottom ashable layer and a top ashable layer, and the patterned first transfer layer is formed on the top ashable layer.

18. The method of claim 17, further comprising forming a patterned second transfer layer between the bottom ashable layer and the top ashable layer,
- wherein a critical dimension of the patterned second transfer layer is greater than the critical dimension of the patterned first transfer layer; and
- wherein the step of sequentially transferring the patterns of the patterned first transfer layer or the patterns of the complementary layer of the patterned first transfer layer to the first ashable layer and the material layer comprises:
- removing a portion of the bottom ashable layer and a portion of the top ashable layer, using the patterned first transfer layer and the patterned second transfer layer as a mask, so as to form a patterned ashable structure; and
- removing a portion of the material layer using the patterned ashable structure as a mask, so as to form a dual damascene opening in the material layer.

* * * * *